United States Patent [19]

Pfisterer et al.

[11] 4,432,041
[45] Feb. 14, 1984

[54] SMOKE PENETRATING EMERGENCY LIGHT

[75] Inventors: Richard E. Pfisterer, Chicago; Richard M. Schultz, Oakwood Hills, both of Ill.

[73] Assignee: Firex Corporation, Downers Grove, Ill.

[21] Appl. No.: 453,603

[22] Filed: Dec. 27, 1982

[51] Int. Cl.³ .............................................. H04M 1/22
[52] U.S. Cl. ...................................... 362/86; 362/186; 362/200; 362/208; 362/253; 362/276; 362/802; 200/60; 340/521; 340/540; 340/636
[58] Field of Search ................. 362/86, 186, 208, 200, 362/253, 276, 802; 200/60; 340/521, 540, 636

[56] References Cited

U.S. PATENT DOCUMENTS

| | | |
|---|---|---|
| 3,582,671 | 6/1971 | Ott . |
| 3,786,342 | 1/1974 | Molyneux . |
| 3,893,081 | 7/1975 | Hopkins . |
| 4,001,803 | 1/1977 | Lombardo . |
| 4,001,805 | 1/1977 | Golbe . |
| 4,199,754 | 4/1980 | Johnson et al. . |
| 4,227,191 | 10/1980 | Raber . |
| 4,250,499 | 2/1981 | Kienzle . |
| 4,251,811 | 2/1981 | Wittlinger . |
| 4,257,039 | 3/1981 | Webb et al. .......................... 362/276 |
| 4,258,291 | 3/1981 | Scott et al. . |
| 4,283,657 | 8/1981 | Gordon et al. . |
| 4,287,517 | 9/1981 | Nagel . |
| 4,305,069 | 12/1981 | Machen et al. . |

Primary Examiner—Stephen J. Lechert, Jr.
Attorney, Agent, or Firm—Welsh & Katz

[57] ABSTRACT

A self-contained, portable lighting apparatus is disclosed. The apparatus functions as an escape light in conjunction with smoke detector alarms in that it is activated by detecting the sound of such alarms. A lighting unit includes circuitry for detecting the alarm of a smoke detector, integrating the detected signal over a predetermined time to minimize the incidence of false alarm, circuitry for delaying the shutting off of the light after the alarm signal has ceased and circuitry for detecting a low voltage condition of the batteries and for providing an intermittent sound that is indicative of a low voltage battery condition.

12 Claims, 3 Drawing Figures

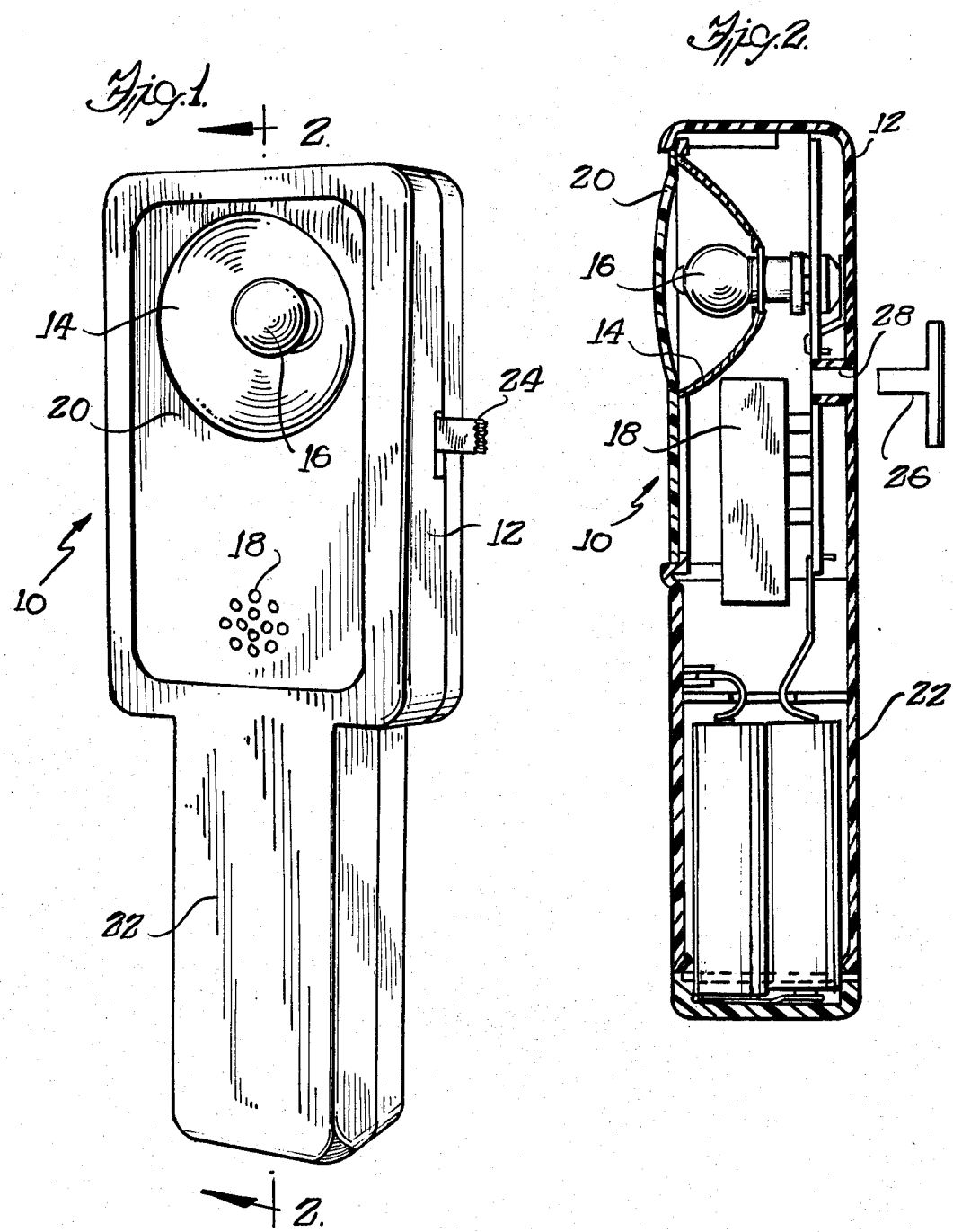

SMOKE PENETRATING EMERGENCY LIGHT

The present invention generally relates to portable lighting units, and particularly escape lighting units which are turned on by a smoke detector alarm.

Technological advances coupled with increased concern for safety has resulted in a significantly increased acceptance of smoke and fire detectors in homes and apartments. Because many recent smoke detector products are self-contained and inexpensive, many people provide several of these units throughout their homes or apartments. The detection of fire or smoke causes them to emit a relatively loud alarm for awakening the occupants of the residence so that they can escape. The greatest danger naturally occurs at night when the occupants are sleeping. The alarm will hopefully awaken the occupants so that they can escape before they are overcome by smoke or are trapped by fire. It is not unlikely that if a fire has progressed appreciably, the lights of a residence will be inoperative. More significantly, if the occupants are awakened by an alarm and do encounter appreciable smoke, they may become disoriented particularly if thick smoke is present. The disorienting effect together with the panic of the moment may result in the occupants not being able to find light switches which would aid in their escape from the residence.

While escape lights that are automatically turned on in the event of an alarm condition do exist in the prior art, many of them are integrally designed into the smoke detecting units or are physically wired to a fire alarm or smoke detecting system. While one prior art design is self-contained and does respond to an alarm of a smoke or fire detector, e.g., the "flite light" marketed by Sears, Roebuck & Co., it does not have all of the desirable attributes of the present invention.

Accordingly, it is an object of the present invention to provide an improved escape light which has desirable features that are not found in prior art devices, which can be used with virtually any existing smoke or fire detector that is presently installed in millions of residences.

Yet another object of the present invention is to provide an improved escape light which detects an alarm sound from a smoke or fire detector and automatically turns on if the alarm sound meets frequency and amplitude requirements and which contains a unique circuit design which provides an intermittent alerting sound to the occupants in the event of a low battery voltage condition.

A more specific object lies in the provision of an extremely efficient circuit design which utilizes a piezo-ceramic transducer which acts as a microphone to detect an alarm sound for activating the light, and wherein the transducer also provides the alerting sound to the occupant in the event of a low battery voltage condition.

Still another object lies in the unique circuit design which efficiently and reliably detects the low battery voltage condition.

Other objects and advantages will become apparent upon reading the following detailed description, while referring to the attached drawings, in which:

FIG. 1 is a perspective view of the lighting unit of the present invention;

FIG. 2 is a cross section taken generally along the line 2-2 of FIG. 1; and,

DETAILED DESCRIPTION

Figure 3:
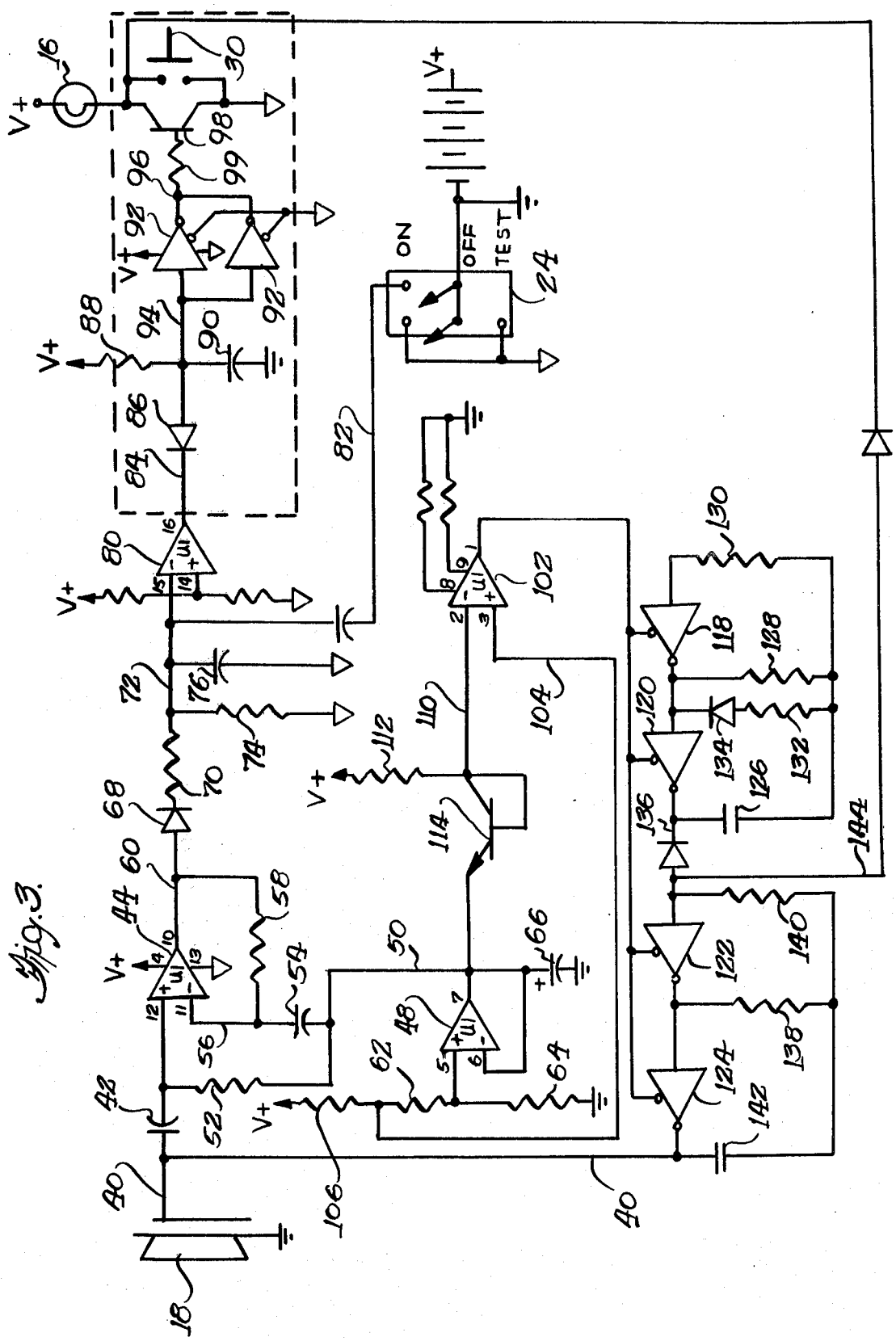
FIG. 3 is a detailed electrical schematic diagram illustrating the circuitry of the present invention.

Broadly stated, the lighting unit of the present invention is particularly designed to operate as an escape light to be used in conjunction with fire and/or smoke detectors which emit a shrill alarm when activated. The lighting unit has a piezo-ceramic transducer that detects sound waves and automatically turns the escape lighting unit on if the sound that is detected by the unit is within a predetermined frequency range and is sufficiently loud. The piezo-ceramic transducer converts sound into an electrical signal that is applied to other circuitry which measures the amplitude of the signal within a predetermined frequency range. If the detected sound is sufficiently loud so as to provide an electrical signal that has sufficient amplitude for a predetermined period of time, then the light will be automatically turned on, provided that the lighting unit is switched to its automatic position. The lighting unit also has circuitry which detects the voltage level of the batteries that are contained within it and if the battery voltage drops below a predetemined threshold level, then the lighting unit provides an intermittent chirp signal through the same piezo-ceramic transducer that is used as a detector and the chirp signal alerts the occupants that the battery should be charged. The lighting unit has two switches which control its operation. Preferably, the lighting unit is attached to a bracket on the wall at an elevation such that a person can easily remove the escape light and carry while attempting to flee the building or area. The lighting unit has a protruding actuator in the back thereof which is normally pressed in by the bracket and this actuator holds an internal switch in a normally open condition which enables the lighting unit to be operated in its automatic mode. A separate switch on the side of the unit has three positions, namely a test position, off position and an automatic operation position. When the switch is placed in the automatic operation position, it is armed to detect sound and will automatically turn on in the event that an alarm signal is detected for a predetermined time. If the light is turned on, it will remain turned on for a period of time after cessation of the alarm or will be maintained in its on condition as long as the alarm is sounding. If the lighting unit is removed from the bracket, then the acuatator member is allowed to spring out from the back of the lighting unit and the switch will be closed which will keep the light on after the alarm ceases. This happens automatically when the unit is removed from its mounting bracket, thus allowing the user an automatic method of keeping the light on during exit from the smoke and sound environment. Switching the side switch to the off position will turn the light as well as all other circuitry off as is desired.

Turning now to the drawings, and particularly FIG. 1, the escape lighting unit indicated generally at 10 is shown in FIG. 1 to have a wide body portion 12 which contains a generally parabolic shaped circular reflector 14 in which a lamp 16 is held by a socket. A piezo-ceramic sound transducer 18 is located in the wide body portion 12 below the reflector 14 in position to either detect or emit sound. The entire front side of the portion 12 contains a lens member 20 which is preferably yellow colored so as to minimize the light penetration in a smoke filled environment. The lens portion 20 has a number of openings immediately forwardly of the transducer 18 so that sound can easily be transmitted through the lens member 20. The lighting unit 10 has a relatively narrower lower portion 22 which defines a handle and also defines a housing in which the batteries of the unit are contained. A switch 24 located on the side thereof is a three position switch which is adapted to maintain the unit completely off or in its test position or in an automatic condition. The lighting unit is adapted to be mounted to the wall with a bracket that is not shown in detail. When the unit is held by the bracket, the actuator is held in and maintains a switch in a normally open condition as will be more fully described hereinafter.

Turning now to the electrical schematic diagram shown in FIG. 3, the piezo-ceramic sound transducer 18 is shown in the upper left-hand corner and is a two terminal device, one terminal of which is connected to line 40 which extends to a high pass filter 42 as well as to a number of circuit components on the lower portion of the drawing which comprise part of the low voltage detection and alarm generating circuitry. A significant desirable aspect of the present invention lies in the economy and efficiency of the circuit design whereby the sound transducer not only functions as a microphone to detect alarm signals from other smoke detectors for the purpose of activating the lighting unit of the present invention, but also to provide an alarm sound in the event the voltage supplied by the batteries drops below a predetermined threshold level indicating the batteries should be replaced. The single piezo-ceramic transducer 18 functions to detect and emit alarm sounds.

Returning to the specific circuitry, the high pass filter 42 is connected to the plus input of an operational amplifier 44 via line 46 which amplifier operates as a signal amplifier of the signal applied on line 46. The piezo-ceramic element generates an a.c. signal that is applied on line 46 which also has a three volt d.c. level provided by an operational amplifier 48 via output line 50 and a resistor 52. Line 50 is also connected to a capacitor 54 and it is connected to the negative input via line 56 and to a resistor 58 that is in turn connected to line 60 the output of the amplifier. Resistor 58 and capacitor 54 function as a filter to pass signals having a frequency within the range of about two to about four kHz, i.e., the desired frequency range of most alarm signals that are provided by smoke or fire detectors.

The voltage level on line 46 of approximately three volts is provided by a voltage divider comprised of resistors 62 and 64. A relatively large capacitor 66 provides charge to the amplifier 44 to insure that enough current is provided during operation. The amplifier 44 output line 60 is connected to a diode 68 which half wave rectifies the output signal. The diode is connected to resistor 70 which in turn is connected to a resistor 74, a capacitor 76, a capacitor 78 and to the negative input of a comparator 80 via line 72. The capacitance of the capacitor 78 is about ten times that of the capacitor 76 and it is connected to the switch 24 via line 82 for the purpose of changing the time constant of an integrator that is comprised of the resistor 70 together with either of capacitors 76 or 78. When the switch 24 is placed in the test mode, then line 82 is not grounded and the integrator is essentially comprised of the resistor 70 and the smaller capacitor 76 which requires much less time in which to activate the comparator 80. With the values of the resistor and capacitor 78, the time constant is preferably about five seconds which means that a signal within the prescribed frequency range and of sufficient amplitude must be present for about five seconds before the comparator 80 is switched. This aids in minimizing false alarms that may be caused by spurious commonly occurring household noises. When the apparatus is placed in the test mode, the time constant is changed by a factor of ten so that only about one-half second of the required signal is needed to activate the comparator 80.

When the comparator 80 is activated by a sufficient amplitude signal within the prescribed frequency range and duration, its output line 84 will be switched low. The line 84 is connected to a diode 86 and resistor 88 which in turn are connected to a capacitor 90 and a pair of inverters 92. When the output on line 84 goes low, the signal on line 94 is also low and the inverters 92 provide a high output on line 96 which is connected to the base of a transistor 98 via resistor 100. The high output on line 96 places the transistor 98 into conduction which provides a ground path for the voltage supply V+ through the lamp 16 and lights the same. The normally open switch 30 bypasses the switching transistor so that when the lighting unit is removed from its bracket, the switch 30 will be closed and the light will be turned on. The value of the capacitor 90 is such that a delay of about eight to ten seconds is provided before the light will be switched off after the comparator output on line 84 goes high. Stated in other words, once the comparator 80 is triggered initially, its output will immediately go low and the inverters 92 will be switched high so as to immediately turn on the lamp 16 by switching the transistor 98 into conduction. When the comparator 80 switches high as a result of cessation of the alarm signal being detected, then the high voltage will charge the capacitor 90 via the resistor 88 and a delay will be produced in the amount of eight to ten seconds before the threshold of inverters 92 is reached. When the voltage raises above the threshold, the inverter outputs on line 96 are switched low again which shuts off transistor 98 as well as the lamp 16.

The voltage v+ that is provided at various locations of the circuitry originates from battery 100 which is preferably four 1½ volt type AA alkaline batteries that are located in the portion 22 of the lighting unit. Because it is obviously important that the lighting unit operate when it is needed, the circuitry of FIG. 3 is also adapted to detect the level of the batteries and provide an alerting chirp signal from the piezo-ceramic element 18 in the event that the voltage level of the batteries drops below a predetermined value of approximately 4.5 to 4.75 volts from its optimum level of approximately 6 volts. This is done by a comparator 102 which compares the voltage level on an input line 104 that is set at approximately 4.5 V as determined by the relative values of resistors 106, 62 and 64 which perform a voltage divider function. The level on line 104 is compared against the voltage level on line 110. The line 110 is connected to the source voltage V+ through resistor 112 and to both the emitter and the base of a diode connected transistor 114. The diode connected transistor 114 provides a fixed voltage drop. The use of the transistor in this manner keeps the comparison threshold voltage at a good level and provides low current operation which is linearly dependent on operating voltage and the transistor is much less expensive than a conventional Zener diode for example. The low voltage detection circuit compares the fraction of the supply voltage on line 104 from the voltage divider operation of resistors 106, 62 and 64 with the reference voltage less the drop across resistor 112 less a fixed voltage drop across the transistor. The fixed voltage drop provides a voltage on line 110 that has a different slope than that appearing on line 104 as the battery voltage declines through use or time.

When the voltage of the battery drops below the threshold of about 4.5 volts, the output of the comparator 102 which appears on line 116 will go low and will enable four inverters which are connected to function as oscillators for providing an intermittent chirping signal to the piezo-ceramic transducer 18. The inverters 118, 120, 122 and 124 as well as the inverters 92 are preferably National Semiconductors inverters No. MM80C98. The inverters 118 and 120, together with a capacitor 126 and resistors 128 and 130 preferably provide a relatively long oscillatory period, i.e., on the order of about 60 seconds and the resistor 132 and diode 134 alter the duty cycle of the circuit so that the output of the inverter 120 appearing on line 136 will be low for approximately one-half second every 60 seconds. When line 136 is low, the inverters 122 and 124 together with resistors 138, 140 and capacitor 142 provide an approximately three kHz oscillatory signal on line 40 which is applied to the piezo-ceramic transducer 18 which emit the alarm sound. A line 144 connects the input of the inverter 122 to the collector of transistor 98 and effectively disables the generation of any alarm sound when the switch 30 is closed when the device is being used as a light after having been removed from its holding bracket.

From the foregoing description, it should be appreciated that an improved escape lighting unit has been shown and described. The unit has a very efficient electrical design which enables a piezo-ceramic transducer to operate both as a sound detector as well as a sound producer. The lighting unit reacts to legitimate detector alarms by integrating a signal having a requisite frequency and ampliude over a period of time to minimize the likelihood of a false alarm activating the lighting unit. Moreover, the circuitry maintains the light on for a period of time after cessation of the alarm signal. The voltage level detector circuitry is economical to manufacture and is reliable in its operation.

It is, of course, understood that although preferred embodiments of the present invention have been illustrated and described herein, various modifications thereof will be apparent to those of ordinary skill in the art and, accordingly, the scope of the present invention should be defined only by the appended claims and equivalents thereof.

Various features of the invention are set forth in the following claims.

What is claimed is:

1. A self-contained portable lighting unit having a housing, a light directing reflector, a lamp, and a compartment for holding one or more batteries for powering the unit, the lighting unit being particularly adapted to function as an emergency light, said unit comprising:
   a piezo-ceramic transducer for producing an electrical signal proportional to the intensity of the sound that is detected thereby and for providing an audible alarm in response to an electrical signal being applied thereto;
   electrical circuit means connected to said transducer and receiving the electrical signal produced thereby, said circuit means activating said lamp in response to said signal having a predetermined minimum magnitude for a predetermined time;
   means for monitoring the voltage level of the battery and providing an intermittent signal of predetermined frequency to said transducing means to cause the same to emit an audible alarm sound in the event the voltage level of the battery drops below a predetermined level.

2. A portable lighting unit as defined in claim 1 wherein said electrical circuit means further comprises:
   means for amplifying said detected signal and for filtering the same to produce an output signal within a predetermined frequency range;
   means for integrating said output signal and providing an integrating means output signal in the event the integrated value exceeds a predetermined level;
   means connected to said integrating means for activating said lamp in response to receiving said integrating means output signal.

3. A lighting unit as defined in claim 2 wherein said monitoring means comprises:
   a comparaor having two inputs and providing an active signal in the event the voltage applied to one input is less than that applied to the other input thereof;
   a voltage dividing means connected to the battery and providing a voltage to one input comparator thereof that is directly proportional to the voltage supplied by the battery;
   transistor means having its base and collector connected to the other comparator input and to the battery through a resistor, its emitter connected to ground through a capacitor and to the output of an amplifier means connected to provide a constant voltage output, said amplifier means having a positive input connected to the battery through a second voltage divider means and its negative input connected to its output.

4. A lighting unit as defined in claim 3 wherein said transistor comprises a NPN transistor having its emitter connected to said amplifier means and its base and collector connected to the battery through said first resistor and to said other input of said comparator.

5. A lighting unit as defined in claim 2 wherein said predetermined frequency range is within the range of about 2,000 to about 4,000 Hertz.

6. A lighting unit as defined in claim 2 wherein said activating means includes a transistor connected between the lamp and ground, said transistor being switched into conduction in response to said integrating means providing said active output signal.

7. A lighting unit as defined in claim 6 wherein said activating means comprises:
   a comparator having one input connected to the output of said integrating means and a second input containing a reference voltage level, said comparator providing an active output level when the magnitude of the output signal from said integrating means exceeds a predetermined level;
   a diode and resistor connected in parallel to the output of said comparator, with the cathode of said diode being connected thereto;
   an inverter having its input connected to the anode of said diode and to ground through a capacitor, the output of said inverter being operably connected to the base of said transistor.

8. A portable lighting unit which is adapted to be powered by a battery contained therein and which is particularly useful as an emergency lighting unit, comprising:
   a housing for containing the battery unit, said housing having a light directing reflector therein for generally directing the light produced from a lamp predominately in one direction;

a piezo-ceramic transducer mounted in the enclosure for producing an electrical signal that is directly proportional to the sound that is detected thereby, said transducer being capable of providing an alarm sound in response to an electrical signal being applied thereto;

means for amplifying and filtering the detected signal and producing an amplified signal corresponding to the detected signal within a predetermined frequency range;

means connected to said amplifying means for integrating said amplified signal and providing an output signal in the event the integrated value exceeds a predetermined level;

means connected to said integrating means for activating said lamp in response to receiving said active output signal;

means for monitoring the voltage level of the battery and providing an intermittent signal of predetermined frequency to said transducing means to cause the same to emit an audible alarm sound in the event the voltage level of the battery drops below a predetermined level.

9. A lighting unit as defined in claim 8 wherein said lamp is a high intensity incandescent having light emission within the range of 4,000 Angstrom to about 6,000 Angstrom, with a substantial proportion of its light emission being within the range of 5,800 Angstroms plus or minus 100 Angstroms.

10. A lighting unit as defined in claim 9 wherein said enclosure has a lens overlying the reflector and lamp, said lens having a transmission characteristic which transmits light within the range of 5,700 Angstrom to about 5,900 Angstrom.

11. A circuit for detecting a low voltage condition of a battery, comprising:

a voltage comparator having two inputs and providing an active signal in the event the voltage applied to one input is less than that applied to the other input thereof;

a voltage dividing means connected to the battery and providing a voltage to one input comparator thereof that is directly proportional to the voltage supplied by the battery;

transistor means having its base and collector connected to the other comparator input and to the battery through a resistor, its emitter connected to ground through a capacitor and to the output of an amplifier means connected to provide a constant voltage output, said amplifier means having a positive input connected to the battery through a second voltage divider means and its negative input connected to its output.

12. The circuit as defined in claim 11 wherein said transistor comprises a NPN transistor having its emitter connected to said amplifier means and its base and collector connected to the battery through said first resistor and to said other input of said comparator.

* * * * *